United States Patent
Ogino et al.

(10) Patent No.: US 10,147,783 B2
(45) Date of Patent: Dec. 4, 2018

(54) ON-CHIP CAPACITORS WITH FLOATING ISLANDS

(71) Applicant: GLOBALFOUNDRIES Inc., Grand Cayman (KY)

(72) Inventors: Atsushi Ogino, Fishkill, NY (US); Vikrant Chauhan, Cohoes, NY (US); Kong Boon Yeap, Clifton Park, NY (US); Ahmed Hassan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/463,465

(22) Filed: Mar. 20, 2017

(65) Prior Publication Data
US 2018/0269275 A1   Sep. 20, 2018

(51) Int. Cl.
*H01L 49/02*    (2006.01)

(52) U.S. Cl.
CPC ................... *H01L 28/88* (2013.01)

(58) Field of Classification Search
CPC ........... H01L 21/7687; H01L 23/49589; H01L 23/5223; H01L 27/0288; H01L 27/0629; H01L 27/0727; H01L 27/0733; H01L 27/0794; H01L 27/1085; H01L 27/3265; H01L 28/40; H01L 29/66181; H01L 29/7408; H01L 2924/1205; H01L 2924/19041
USPC .......... 257/20, 194, 135–136, 213–413, 900, 257/902–903
See application file for complete search history.

(56) References Cited

U.S. PATENT DOCUMENTS

| | | | |
|---|---|---|---|
| 7,811,919 B2 | 10/2010 | Daley et al. | |
| 8,169,050 B2 | 5/2012 | Daley et al. | |
| 8,237,243 B2 | 8/2012 | Daley et al. | |
| 8,809,144 B2 | 8/2014 | Daley et al. | |
| 8,856,715 B1* | 10/2014 | Stephens | G06F 17/5077 716/100 |
| 2008/0252171 A1 | 10/2008 | Kirigaya et al. | |
| 2011/0254132 A1* | 10/2011 | Cho | H01G 4/232 257/534 |
| 2012/0007214 A1* | 1/2012 | Chu | H01L 23/5223 257/532 |
| 2014/0225225 A1* | 8/2014 | Chung | H01L 28/40 257/532 |
| 2015/0064912 A1 | 3/2015 | Jang et al. | |

(Continued)

OTHER PUBLICATIONS

Taiwan Intellectual Propery Office, Examination Report and English translation issued in Application No. 107102046 dated Sep. 12, 2018.

*Primary Examiner* — Moin Rahman
(74) *Attorney, Agent, or Firm* — Thompson Hine LLP; Anthony Canale (57) ABSTRACT

Structures for an on-chip capacitor and methods of forming an on-chip capacitor. A metal terminal is formed that has a side edge. Metal fingers are formed that have a parallel arrangement. Floating islands comprised of a metal are formed and are electrically isolated from the metal fingers. Each of the metal fingers has an end and extends from the side edge of the metal terminal toward the end. Each of the floating islands is arranged in a spaced relationship with the end of a respective one of the metal fingers.

16 Claims, 7 Drawing Sheets

(56) References Cited

U.S. PATENT DOCUMENTS

2015/0357120 A1\* 12/2015 Augur .................... H01G 4/005
　　　　　　　　　　　　　　　　　　　361/301.4

\* cited by examiner

ON-CHIP CAPACITORS WITH FLOATING ISLANDS

BACKGROUND

The present invention relates to integrated circuits and semiconductor device fabrication and, more specifically, to structures for an on-chip capacitor and methods of forming an on-chip capacitor.

Device structures may be fabricated on a substrate by front-end-of-line (FEOL) processing and an interconnect structure fabricated by back-end-of-line (BEOL) processing may be used to electrically couple the FEOL device structures. The metallization levels of a BEOL interconnect structure may be formed using a damascene process. In a dual damascene process, via openings and trenches are formed and simultaneously filled with metal to create a metallization level. In a single-damascene process, the via openings and trenches are separately formed and filled with metal.

On-chip capacitors are components of an integrated circuit that are used for a variety of purposes, such as bypass and capacitive matching as well as coupling and decoupling. On-chip capacitors may be formed in the BEOL interconnect structure. A vertical native capacitor (VNCAP) is constructed from fingers of metal wires and vias that are formed in the BEOL interconnect structure.

Self-aligned patterning methods used in BEOL processing may utilize mandrels as sacrificial structures. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and dielectric layer with, for example, a directional reactive ion etching (RIE). The features formed in the underlying dielectric layer will acquire the line pitch and width established by the sidewall spacers.

Cuts may be formed in mandrels with a cut mask and etching in order to section the mandrels. The cuts define gaps between mandrel tips that are subsequently used to form adjacent wires that are spaced apart at their tips with a tip-to-tip spacing related to the dimensions of the gaps. The pattern of the cut mandrels is transferred to the hardmask used to pattern the dielectric layer. Cuts may also be formed in the hardmask itself and filled by spacer material when sidewall spacers are formed on the mandrels. These cuts are also transferred to the hardmask and are eventually reflected in the patterned dielectric layer.

Improved structures for an on-chip capacitor and methods of forming an on-chip capacitor are needed.

SUMMARY

In an embodiment of the invention, a structure is provided for a capacitor. The structure includes a metal terminal having a side edge, a plurality of metal fingers having a parallel arrangement, and a plurality of floating islands each comprised of metal and electrically isolated from the metal fingers. Each of the metal fingers has an end and extends from the side edge of the metal terminal toward the end. Each of the floating islands is arranged in a spaced relationship with the end of a respective one of the metal fingers.

In an embodiment of the invention, a method is provided for forming a structure for a capacitor. The method includes forming a metal terminal having a side edge, forming a plurality of metal fingers having a parallel arrangement, and forming a plurality of floating islands each comprised of metal and electrically isolated from the metal fingers. Each of the metal fingers has an end and extends from the side edge of the metal terminal toward the end. Each of the floating islands is arranged in a spaced relationship with the end of a respective one of the metal fingers.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
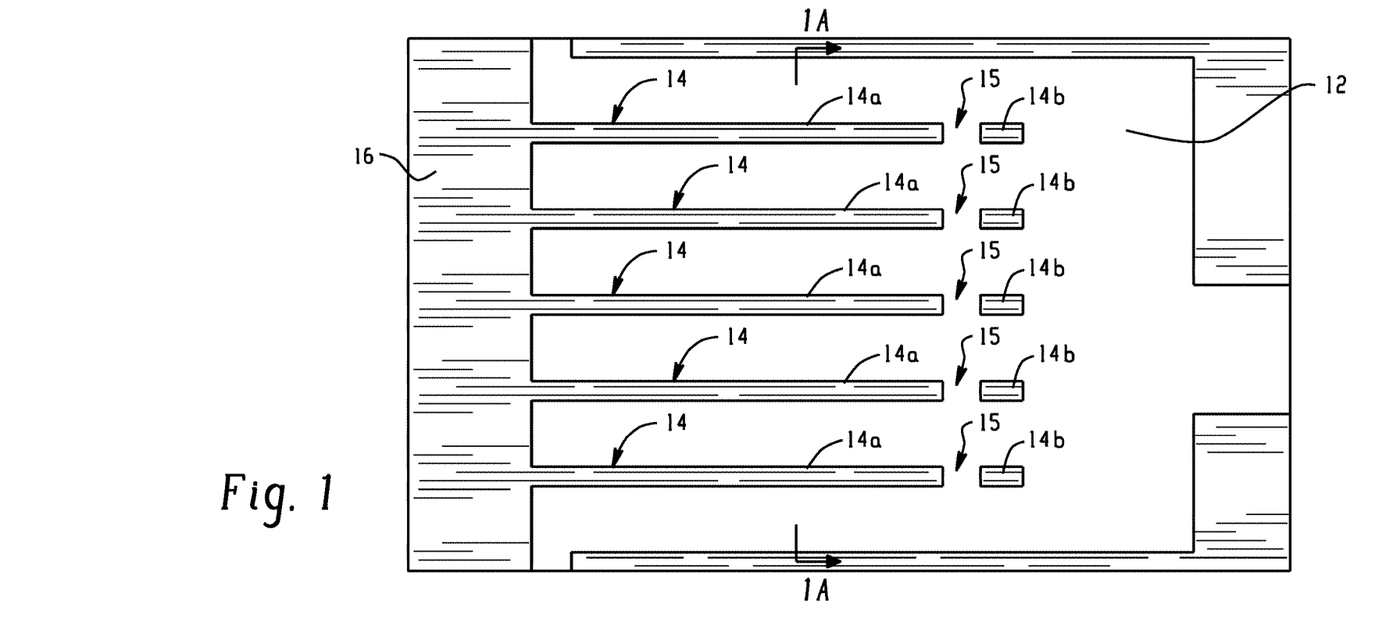
FIGS. 1-5 are top views of a structure at successive stages of a processing method in accordance with embodiments of the invention.
Figure 1A:
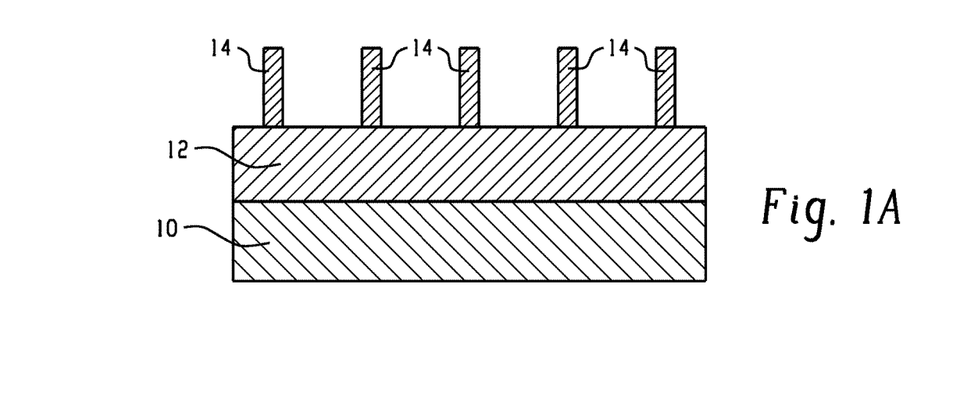
FIG. 1A is a cross-sectional view of the structure taken generally along line 1A-1A in FIG. 1.

With reference to FIGS. 1, 1A and in accordance with embodiments of the invention, a dielectric layer 10 may be located on a substrate (not shown) comprised of, for example, a semiconductor material suitable for forming an integrated circuit and including device structures (not shown) fabricated by front-end-of-line (FEOL) processing to form the integrated circuit. The dielectric layer 10 may be composed of an electrically-insulating dielectric material, such as silicon dioxide ($SiO_2$) or hydrogen-enriched silicon oxycarbide (SiCOH) produced from an octamethylcyclotetrasiloxane (OMCTS) precursor. The dielectric layer 10 may include a capping layer (not shown) of, for example, silicon nitride ($Si_3N_4$) that protects the integrity of the dielectric layer 10 during hardmask patterning.

A hardmask 12 is located on the top surface of the dielectric layer 10. The hardmask 12 may be comprised of a metal, such as titanium nitride (TiN) deposited by a physical vapor deposition (PVD) process. The hardmask 12 is removable from the dielectric layer 10 selective to the material of the dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

Mandrels 14 are formed on the top surface of the hardmask 12, and are arranged in parallel rows. The mandrels 14 are directly connected and continuous at one end with a mandrel section 16 of larger dimensions than the mandrels 14. The mandrels 14 and mandrel section 16 may be concurrently formed by depositing a blanket layer of a material on the entire top surface of the hardmask 12 and patterning the layer by lithography and etching using a lithography stack. The material constituting the mandrels 14 and mandrel section 16 may be silicon (Si), such as amorphous silicon, deposited at a low temperature by chemical vapor deposition (CVD).

Mandrel cuts 15 are formed in the mandrels 14 by applying a cut mask (not shown) and etching to cut the mandrels 14 at respective locations along their lengths. The cut mask may include a photoresist layer that is patterned by exposure to a pattern of radiation from an exposure source projected through a photomask, and developed with a chemical developer to form openings that are situated at the intended locations for the mandrel cuts 15. Sections of the mandrels 14 are removed to form the mandrel cuts 15 at the locations of the openings in the cut mask using an etching process, such as reactive-ion etching (RIE), that is selective to the material of the hardmask 12, which may function as an etch stop.

Each of the mandrels 14 is divided by the mandrel cuts 15 into a long segment 14a connected with the mandrel section 16 and a short segment 14b that is positioned between the short segment 14b and the mandrel section 16. The long segments 14a are lengthier than the short segments 14b, while the widths of the segments 14a, 14b are identical and each segment 14b is linearly aligned with one of the segments 14a in a row. The distance separating each long segment 14a from its adjacent short segment 14b is less than or equal to two times the width of sidewall spacers that are subsequently formed on the top surface of the hardmask 12 adjacent to the vertical sidewalls of the mandrels 14 so that spacer formation closes these gaps.

Figure 2:
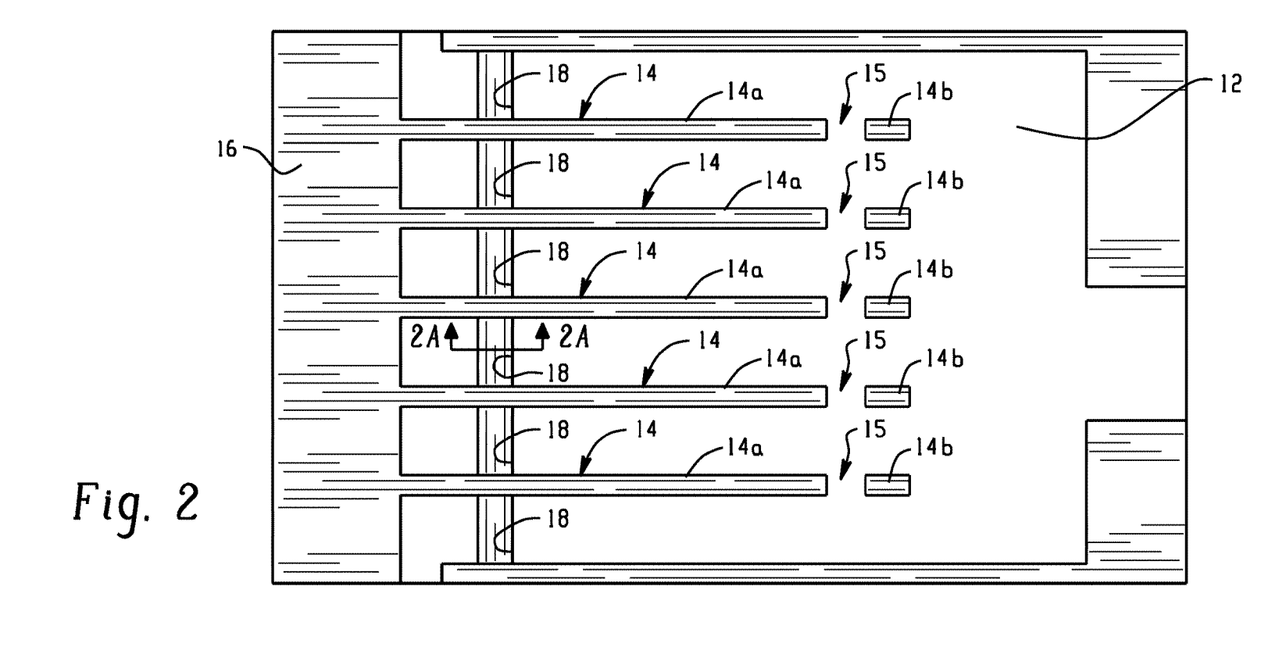
Figure 2A:
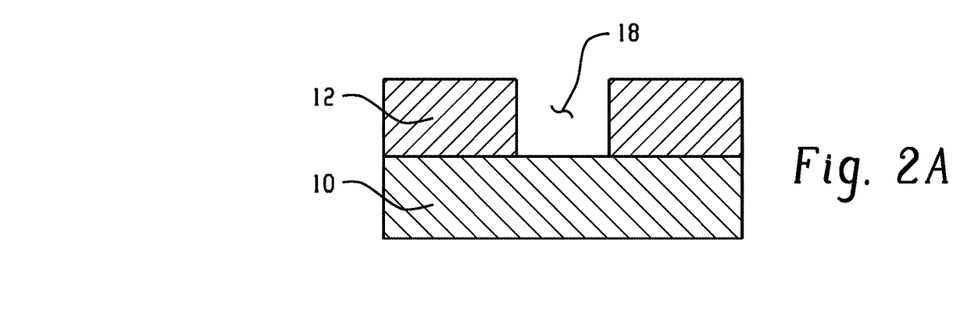
FIG. 2A is a cross-sectional view of the structure taken generally along line 2A-2A in FIG. 2.

With reference to FIGS. 2, 2A in which like reference numerals refer to like features in FIGS. 1, 1A and at a subsequent fabrication stage, a cut mask (not shown) is applied and used to remove the hardmask 12 at selective locations to define non-mandrel cuts 18 extending between the mandrels 14. The cut mask may include a photoresist layer that is patterned by exposure to a pattern of radiation from an exposure source projected through a photomask, and developed with a chemical developer to form openings that are situated at the intended locations for non-mandrel cuts 18 in the hardmask 12. The hardmask 12 is removed to the depth of the dielectric layer 10 at the locations of the non-mandrel cuts 18 using an etching process, such as reactive-ion etching (RIE), with the material of the dielectric layer 10 functioning as an etch stop.

Figure 3:
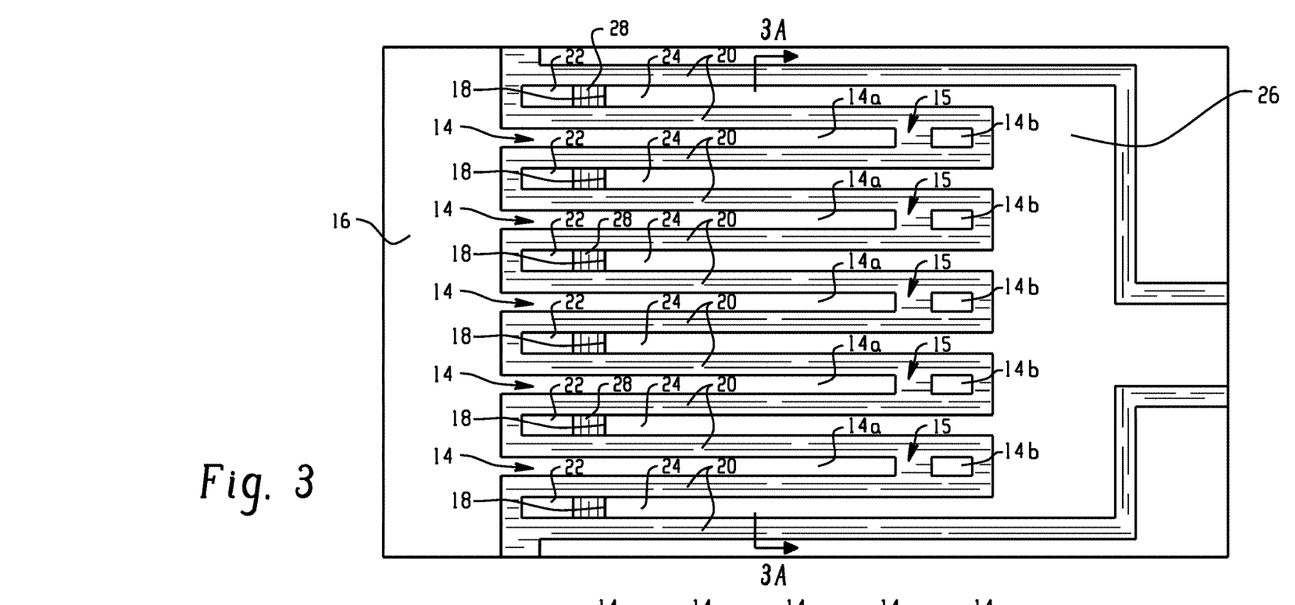
Figure 3A:
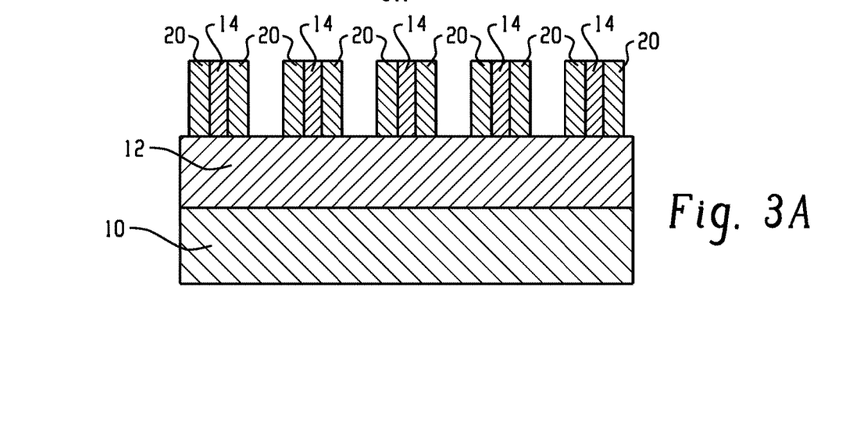
FIG. 3A is a cross-sectional view of the structure taken generally along line 3A-3A in FIG. 3.

With reference to FIGS. 3, 3A in which like reference numerals refer to like features in FIGS. 2, 2A and at a subsequent fabrication stage, sidewall spacers 20 are formed at locations on the top surface of the hardmask 12 adjacent to the vertical sidewalls of the mandrels 14. The sidewall spacers 20 may be formed by depositing a conformal layer comprised of a dielectric material on the mandrels 14 and the top surface of hardmask 12 where exposed by the mandrels 14, and shaping the conformal layer with an anisotropic etching process, such as reactive ion etching (RIE), that preferentially removes the dielectric material from horizontal surfaces. The dielectric material used to form the sidewall spacers 20 also fills the non-mandrel cuts 18 in the hardmask 12.

The material constituting the mandrels 14 may be chosen to be selectively removed relative to the sidewall spacers 20 through the use of a suitable etch chemistry. In an embodiment in which the mandrels 14 are composed of amorphous silicon, the dielectric material constituting the sidewall spacers 20 may be silicon dioxide ($SiO_2$) deposited by atomic layer deposition (ALD).

The exposed surface area of the hardmask 12 is reduced by the formation of the sidewall spacers 20. In particular, after the sidewall spacers 20 are formed, a short non-mandrel section 22 and a long non-mandrel section 24 of the hardmask 12 are exposed between the nearest-neighbor spacers 20 at the side edges of the mandrels 14. Each short non-mandrel section 22 is positioned between the adjacent long non-mandrel section 24 and the mandrel section 16. The non-mandrel cuts 18 are filled by the dielectric material deposited to form the sidewall spacers 20. The dielectric material in the non-mandrel cuts 18 defines respective block mask sections 28. The block mask sections 28 in the non-mandrel cuts 18 provide discontinuities in the hardmask 12 that are located between the different non-mandrel sections 22, 24.

The non-mandrel sections 24 of the hardmask 12 are lengthier than the non-mandrel sections 22 of the hardmask 12, while the widths of the non-mandrel sections 22, 24 are identical and each non-mandrel section 22 is linearly aligned with one of the non-mandrel sections 24 in a row. The distance separating each long non-mandrel section 24 from its adjacent short non-mandrel section 22 is equal to the width of the non-mandrel cuts 18 and block mask sections 28 of dielectric material occupying non-mandrel cuts 18. The long non-mandrel sections 24 of the hardmask 12 are connected and continuous at one end with a non-mandrel section 26 of the hardmask 12 of larger dimensions, which is analogous to the mandrel section 16 and its spatial relationship with the long segments 14a of the mandrels 14.

Figure 4:
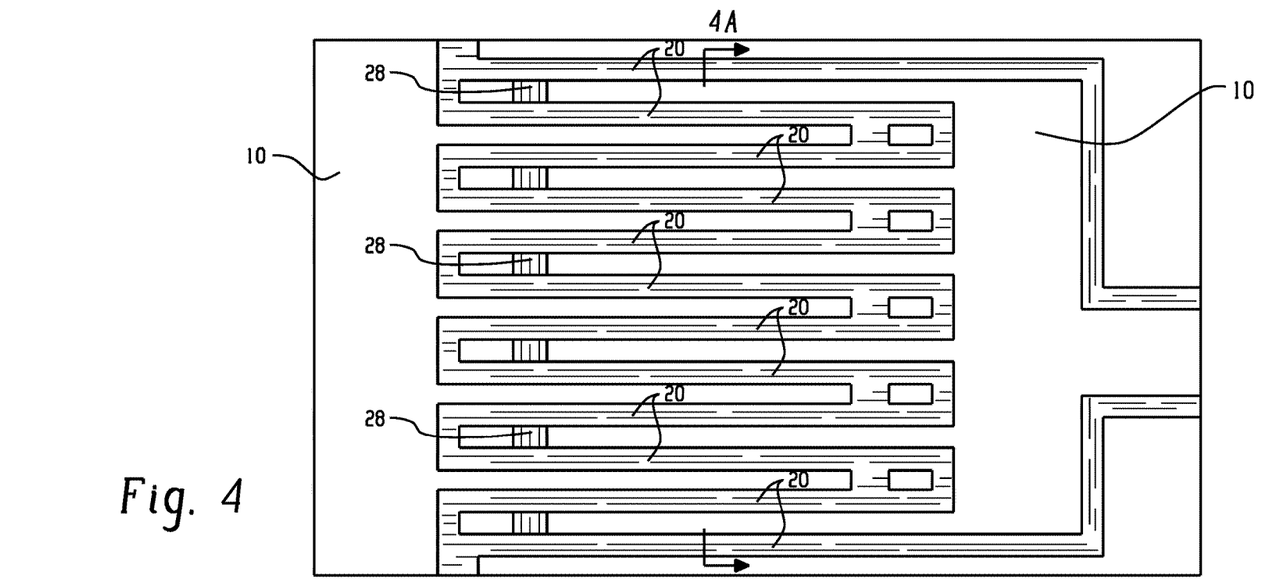
Figure 4A:
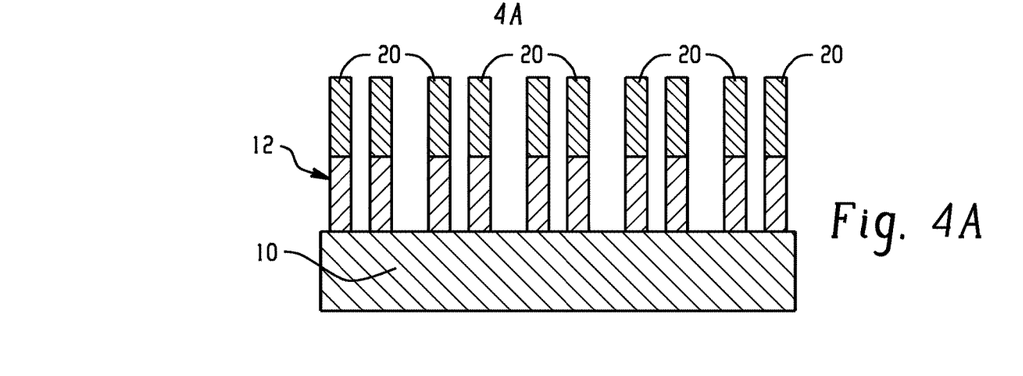
FIG. 4A is a cross-sectional view of the structure taken generally along line 4A-4A in FIG. 4.

With reference to FIGS. 4, 4A in which like reference numerals refer to like features in FIGS. 3, 3A and at a subsequent fabrication stage, the mandrels 14 and mandrel section 16 are removed selective to the sidewall spacers 20 with an etching process having a suitable etch chemistry. The hardmask 12 is exposed over areas from which the mandrels 14 are pulled and the mandrel section 16 is removed by the etching process. The sidewall spacers 20 are arranged in a serpentine pattern that traces back and forth across the top surface of the hardmask 12.

After the mandrels 14 and mandrel section 16 are removed, the hardmask 12 is patterned by an etching process with the sidewall spacers 20 and the dielectric material in the non-mandrel cuts 18 operating as an etch mask. The non-mandrel sections 22, 24, 26 of hardmask 12 are removed along with the areas of hardmask 12 revealed by the pulled mandrels 14 and the removed mandrel section 16. Areas of the hardmask 12 covered by the sidewall spacers 20 and the dielectric material in the non-mandrel cuts 18 are preserved and retained during the etching of the hardmask 12.

Figures 5, 5A:
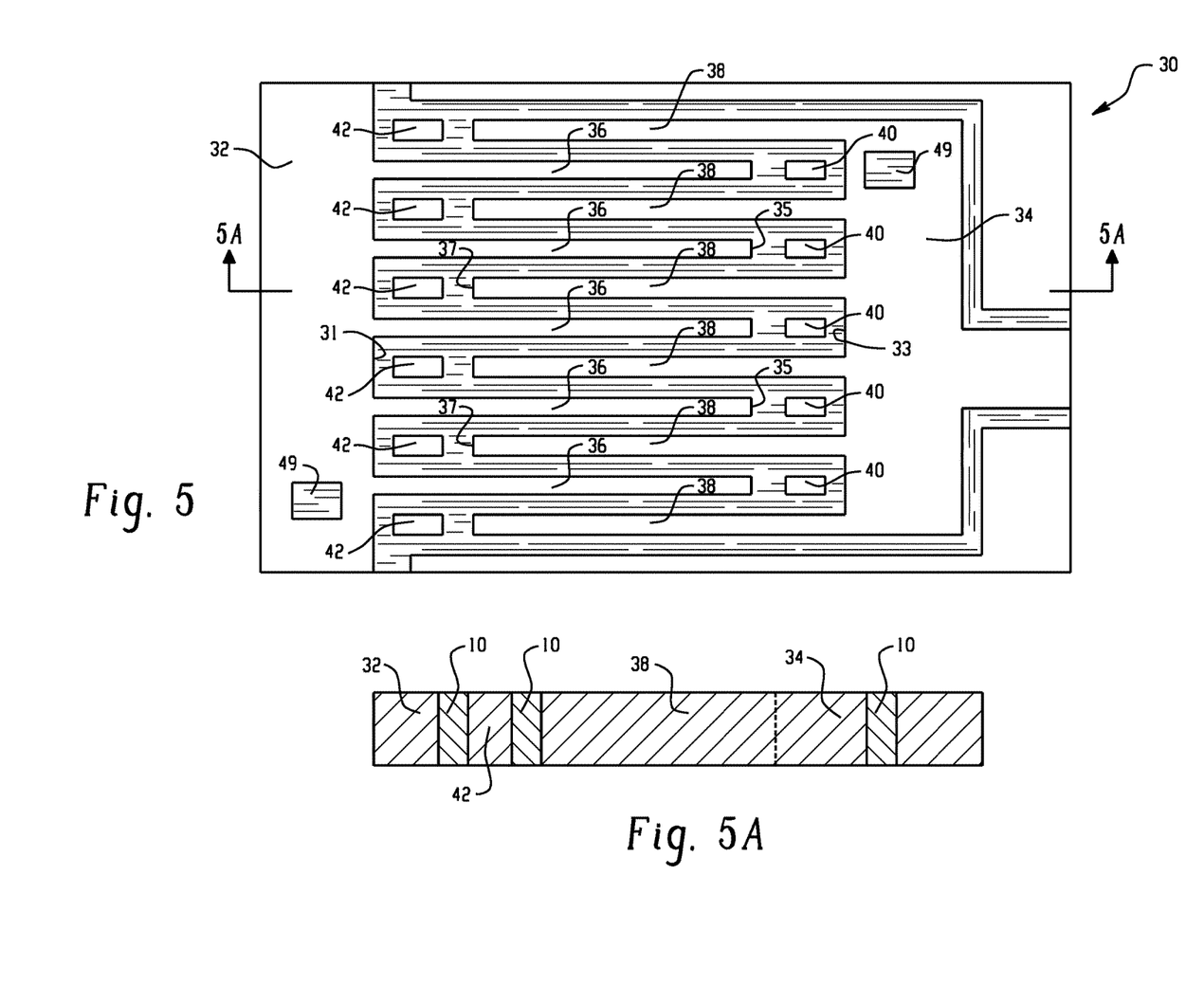
FIG. 5A is a cross-sectional view of the structure taken generally along line 5A-5A in FIG. 5.

With reference to FIGS. 5, 5A in which like reference numerals refer to like features in FIGS. 4, 4A and at a subsequent fabrication stage, the dielectric layer 10 is etched using the hardmask 12 as a patterned etch mask to remove the dielectric layer 10 in areas unmasked by the patterned hardmask 12 and thereby form trenches in the dielectric layer 10. After the dielectric layer 10 is etched, the patterned hardmask 12 may be selectively removed by one or more etching or cleaning processes. The sidewall spacers 20 and the dielectric material in the non-mandrel cuts 18 may be removed along with the patterned hardmask 12 after the dielectric layer 10 is etched, or before the dielectric layer 10 is etched.

During back-end-of-line (BEOL) processing, the trenches in the dielectric layer 10 are filled with a conductor to form metal lines of different dimensions. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches before filling with the primary electrical conductor. The primary conductor may be comprised of a low-resistivity metal formed using a deposition process, such as copper (Cu) formed by electroplating or electroless deposition. The shapes and geometries of the metal lines in the trenches reflect the areas exposed for trench formation in the dielectric layer 10 by the patterned hardmask 12.

The metal lines may contribute to forming a capacitor structure 30, such as a vertical native capacitor (VNCAP). The capacitor structure 30 includes a terminal 32, a terminal 34, fingers 36 that extend lengthwise from a side edge 31 of terminal 32 in a direction toward a side edge 33 of terminal 34, and fingers 38 that extend lengthwise from the side edge 33 of terminal 34 in a direction toward the side edge 31 of terminal 32. The terminal 32 is positioned at the former location of the mandrel section 16, and the terminal 34 is positioned at the former locations of the non-mandrel section 26. The fingers 36 are positioned at the former locations of the long segments 14a of the mandrels 14, and the fingers 38 are positioned at the former locations of the long non-mandrel sections 24 of the hardmask 12. The fingers 36 are interdigitated with the fingers 38 in a comb arrangement that is characteristic of a VNCAP. The side edges of adjacent pairs of the fingers 36, 38 are separated by a strip of the dielectric material of the dielectric layer 10 having a width equal to the width of the sidewall spacers 20.

The capacitor structure 30 further includes floating islands 40 that are arranged between the tips or ends 35 of fingers 36 and the side edge 33 of the terminal 34, and are positioned at the former locations of the short segments 14b of the mandrels 14. More specifically, one of the floating islands 40 is located between the end 35 of each of the fingers 36 and the side edge 33 of the terminal 34. The floating islands 40 and the side edge 33 of the terminal 34 are separated by respective strips of the dielectric material of the dielectric layer 10 that have a width equal to the width of the mandrel cuts 15.

The capacitor structure 30 further includes floating islands 42 that are arranged between the tips or ends 37 of fingers 38 and the side edge 31 of the terminal 32, and are positioned at the former locations of the short non-mandrel sections 22. More specifically, one of the floating islands 42 is located between the end 37 of each of the fingers 38 and the side edge 31 of the terminal 32. The floating islands 42 and the side edge 31 of the terminal 32 are separated by respective strips of the dielectric material of the dielectric layer 10 that have a width equal to the width of the non-mandrel cuts 18.

The spacings established by the thickness of the sidewall spacers 20 may be consistent and uniform between the side edges of adjacent pairs of the fingers 36, 38, between the floating islands 40 and the side edge 33 of terminal 34, and between the floating islands 42 and the side edge 31 of terminal 32. In other words, the spacings in these locations may have the same numerical value (e.g., 20 nanometers). The fingers 36, 38 may also have a width that is equal to the spacings in a symmetrical design. In contrast, the spacings established by the mandrel cuts 15 and the non-mandrel cuts 18 may be less than or equal to twice the thickness of the sidewall spacers 20.

The capacitor structure 30 may include additional levels of wires (e.g., two additional levels) vertically stacked in overlying BEOL metallization levels and that are connected by vertical conductor-filled vias 49. The metal lines in these additional levels may be arranged similar to the metal lines of the illustrated metallization level that form the terminals 32, 34, the fingers 36, 38, and the floating islands 40, 42, and are separated from each other by intervening dielectric layers. Any number (e.g., one or more) of the metallization layers can be employed to provide the capacitor structure 30 with a designated capacitance value.

The terminals 32, 34 may be biased with different polarities in use such that the interdigitated fingers 36, 38 have opposite polarities. For example, the terminal 32 and fingers 36 may be biased with a negative polarity, and the terminal 34 and fingers 38 may be biased with a positive polarity. The floating islands 40, 42 are disconnected from the fingers 36, 38. Rather than being biased when the capacitor structure 30 is charged during use, the floating islands 40, 42 are unbiased and electrically floating. The floating islands 40, 42 are electrical insulated by portions of the dielectric layer 10 from the fingers 36, 38.

The placement of the floating islands 40 at the ends 35 of fingers 36 and the placement of the floating islands 40 at the ends 37 of fingers 38 may be to prevent failure due to degradation of the dielectric layer 10 due to, for example, time dependent dielectric breakdown (TDDB). During use, the magnitude of the electric field at and near the respective ends 35, 37 of the fingers 36, 38 is enhanced (i.e., larger) than at other locations along the length of the fingers 36, 38. The floating islands 40, 42 function to effectively reduce this enhancement by disrupting the electric field, which makes the dielectric material of the dielectric layer 10 less susceptible to the loss of insulating properties (i.e., breakdown) over time that is associated with TDDB.

Figure 6:
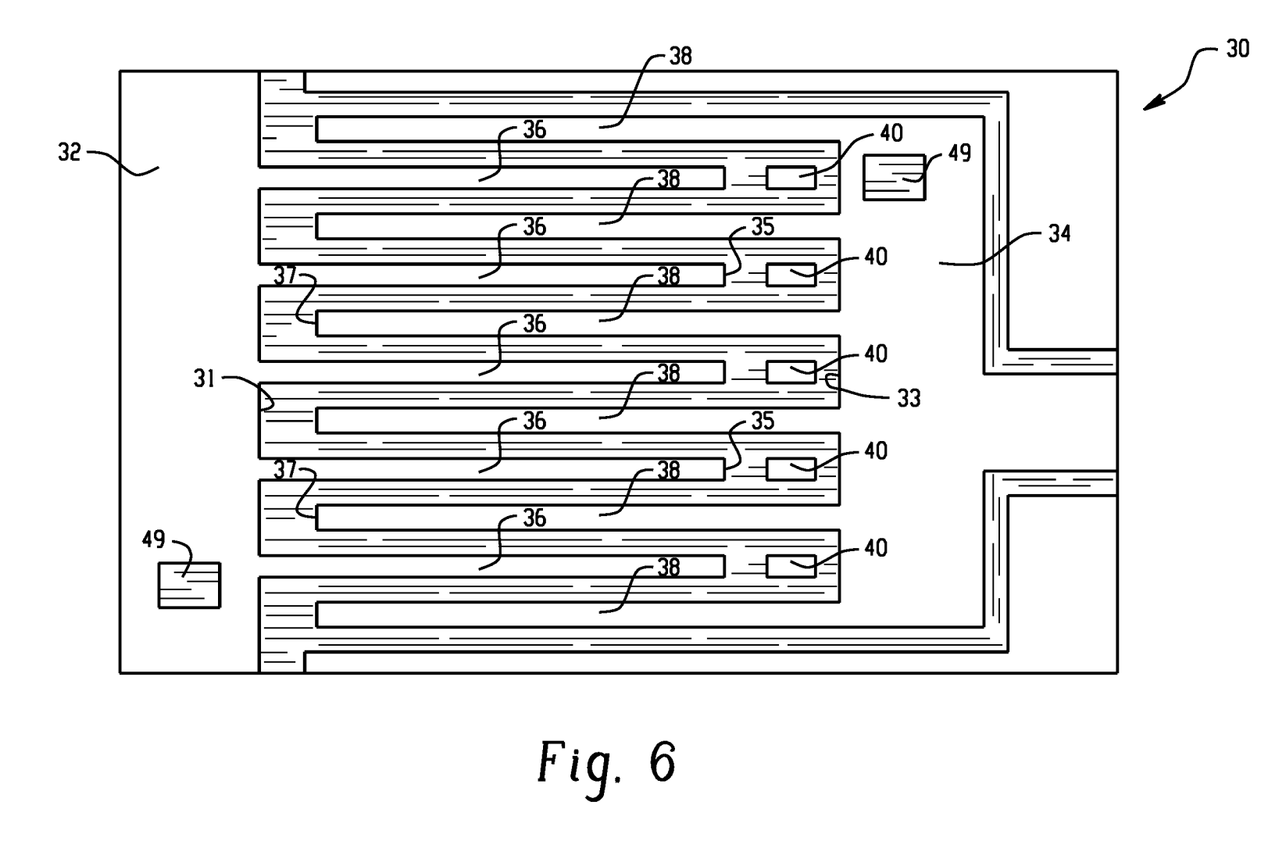
FIG. 6 is top view similar to FIG. 5 of a structure in accordance with embodiments of the invention.

With reference to FIG. 6 in which like reference numerals refer to like features in FIG. 5 and in accordance with alternative embodiments, the floating islands 42 may be eliminated such that intervening floating islands are absent between the ends 37 of fingers 38 and the side edge 31 of the terminal 32. The floating islands 40 persist and are located between the ends 35 of fingers 36 and the side edge 33 of the terminal 34. The distance between the ends 37 of fingers 36 and the side edge 31 of the terminal 32 is not constrained in size by mandrel cuts or spacer formation, which promotes the introduction of a larger spacing between the fingers 38 and terminal 32 that otherwise available when the spacing is dependent on mandrel cuts or spacer formation.

Figure 7:
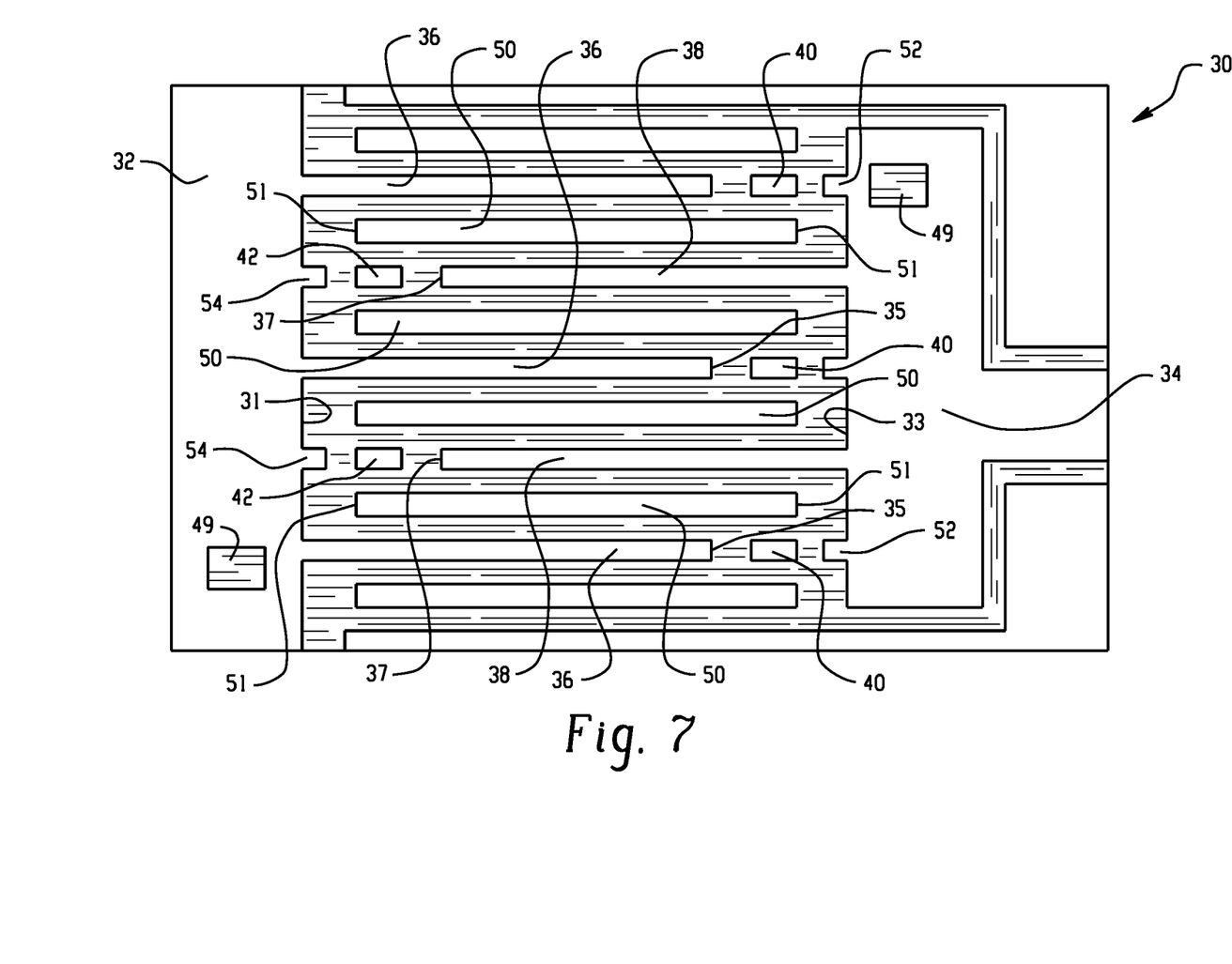
FIG. 7 is top view similar to FIG. 5 of a structure in accordance with embodiments of the invention.

With reference to FIG. 7 in which like reference numerals refer to like features in FIG. 5 and in accordance with alternative embodiments, additional floating islands 50 may be formed by patterning the dielectric layer 10 using the non-mandrel sections 22 of the hardmask 12. The floating islands 50 have opposite ends 51 that are spaced from the side edges 31, 33. The side edge spacing is established through non-mandrel cuts 18 made in the non-mandrel sections 22 and the hardmask 12 at locations equivalent to the opposite ends 51 and filled by block mask sections 28 of dielectric material occupying the non-mandrel cuts 18. To permit the formation of the additional floating islands 50, the fingers 36, 38 and respective floating islands 40, 42 at the ends 35, 37 of the fingers 36, 38 are all formed using the mandrels 14 and mandrel cuts 15. The fingers 38 and floating islands 42 are no longer formed using the non-mandrel sections 22 and non-mandrel cuts 18.

Alternatively, the floating islands 50 may be formed using the mandrels 14 and the mandrel cuts 15 formed in the mandrels 14 at each opposite end 51. The fingers 36, 38 and respective floating islands 40, 42 at the ends 35, 37 of the fingers 36, 38 are then formed using the non-mandrel cuts 18 and block mask sections 28 of dielectric material occupying the non-mandrel cuts 18.

Short finger sections 54 may extend from the side edge 31 of the terminal 32 inwardly toward the floating islands 42, and short finger sections 52 may extend inwardly from the side edge 33 of the terminal 34 toward the floating islands 40. The finger sections 52, 54 may be formed by adjusting the location of mandrel cuts 15 in the mandrels 14 if the floating islands 50 are formed using the non-mandrel sections 22, 24 and non-mandrel cuts 18. Alternatively, the finger sections 52, 54 may be formed by adjusting the location of non-mandrel cuts 18 if the floating islands 50 are formed using the mandrels 14 and the mandrel cuts 15.

In an alternative embodiment, the floating islands 40 or the floating islands 42 may be omitted from the capacitor structure 30. In an alternative embodiment, the floating islands 40 and the floating islands 42 may be omitted from the capacitor structure 30.

While the embodiments have been illustrated in connection with a self-aligned double pattering (SADP) process, a person of ordinary skill in the art will appreciate that the embodiments of the invention may have applicability in other back-end-of-line processes, such as damascene processes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a capacitor, the structure comprising:
   a dielectric layer;
   a first metal terminal having a side edge;
   a second metal terminal having a side edge;
   a first plurality of metal fingers having a parallel arrangement between the side edge of the first terminal and the side edge of the second terminal, each of the first plurality of metal fingers having an end and extending from the side edge of the first metal terminal toward the side edge of the second metal terminal;
   a second plurality of metal fingers having a parallel arrangement between the side edge of the first terminal and the side edge of the second terminal, the second plurality of metal fingers interdigitated with the first plurality of metal fingers in a comb arrangement, and each of the second plurality of metal fingers extending from the side edge of the second metal terminal toward the side edge of the first metal terminal; and
   a first plurality of floating islands each comprised of metal and electrically isolated by the dielectric layer from the first plurality of metal fingers, the first metal terminal, and the second metal terminal, each of the first plurality of floating islands arranged between the end of a respective one of the first plurality of metal fingers and the side edge of the second metal terminal.

2. The structure of claim 1 wherein each of the second plurality of metal fingers has an end, and further comprising:
   a second plurality of floating islands each comprised of metal and electrically isolated from the second plurality of metal fingers, each of the second plurality of floating islands arranged in a spaced relationship with the end of a respective one of the second plurality of metal fingers.

3. The structure of claim 2 wherein each of the second plurality of floating islands is arranged between the end of a respective one of the second plurality of metal fingers and the side edge of the first metal terminal.

4. The structure of claim 1 wherein the first plurality of metal fingers and the second plurality of metal fingers have a side-to-side arrangement with a first spacing, and the first plurality of floating islands are spaced from the side edge of the second metal terminal with the first spacing.

5. The structure of claim 4 further comprising:
   a second plurality of floating islands each comprised of metal and electrically isolated from the second plurality of metal fingers,
   wherein the second plurality of floating islands are spaced from the side edge of the first metal terminal with the first spacing.

6. The structure of claim 5 wherein the first plurality of floating islands are spaced from the respective ends of the first metal fingers with a second spacing greater than the first spacing, and the second plurality of floating islands are spaced from the respective ends of the second metal fingers with the second spacing.

7. The structure of claim 4 wherein the first plurality of floating islands are spaced from the respective ends of the first metal fingers with a second spacing greater than the first spacing.

8. The structure of claim 1 wherein the first plurality of metal fingers, the second plurality of metal fingers, the first terminal, and the second terminal are arranged in the same metallization level.

9. A method of forming a structure for a capacitor, the method comprising:
forming a first metal terminal having a side edge;
forming a second metal terminal having a side edge;
forming a first plurality of metal fingers having a parallel arrangement between the side edge of the first terminal and the side edge of the second terminal;
forming a second plurality of metal fingers having a parallel arrangement between the side edge of the first terminal and the side edge of the second terminal; and
forming a first plurality of floating islands each comprised of metal and electrically isolated by a dielectric layer from the first plurality of metal fingers, the first metal terminal, and the second metal terminal,
wherein each of the first plurality of metal fingers has an end and extends from the side edge of the first metal terminal toward the second metal terminal, the second plurality of metal fingers are interdigitated with the first plurality of metal fingers in a comb arrangement, each of the second plurality of metal fingers extends from the side edge of the second metal terminal toward the side edge of the first metal terminal, and each of the first plurality of floating islands is arranged between the end of a respective one of the first plurality of metal fingers and the side edge of the second metal terminal.

10. The method of claim 9 wherein forming the first plurality of floating islands each comprised of metal and electrically isolated by the dielectric layer from the first plurality of metal fingers, the first metal terminal, and the second metal terminal comprises:
forming a hardmask layer on a dielectric layer;
forming a plurality of mandrels on the hardmask layer; and
cutting the plurality of mandrels to divide each mandrel into a long segment and a short segment,
wherein each of the first plurality of metal fingers is formed at the location of the long segment of one of the plurality of mandrels and each of the first plurality of floating islands is formed at the location of the short segment of one of the plurality of mandrels.

11. The method of claim 9 wherein forming the first plurality of floating islands each comprised of metal and electrically isolated by the dielectric layer from the first plurality of metal fingers, the first metal terminal, and the second metal terminal comprises:
forming a hardmask layer on a dielectric layer;
forming a plurality of mandrels on the hardmask layer;
removing the hardmask at selected locations between the mandrels to define cuts in the hardmask; and
forming sidewall spacers adjacent to the mandrels,
wherein the sidewall spacers on adjacent mandrels are separated by a section of the hardmask divided by one of the cuts into a long segment and a short segment, each of the first plurality of metal fingers is formed at the location of the long segment of one of the plurality of sections of the hardmask and each of the first plurality of floating islands is formed at the location of the short segment of one of the plurality of mandrels.

12. The method of claim 9 wherein each of the second plurality of metal fingers has an end, and further comprising:
forming a second plurality of floating islands each comprised of metal and electrically isolated from the second plurality of metal fingers, each of the second plurality of floating islands arranged in a spaced relationship with the end of a respective one of the second plurality of metal fingers.

13. The method of claim 9 wherein each of the second plurality of floating islands is arranged between the end of a respective one of the second plurality of metal fingers and the side edge of the first metal terminal.

14. The method of claim 9 wherein the first plurality of metal fingers and the second plurality of metal fingers have a side-to-side arrangement with a first spacing, and the first plurality of floating islands are spaced from the side edge of the second metal terminal with the first spacing.

15. The method of claim 14 wherein the first plurality of floating islands are spaced from the respective ends of the first metal fingers with a second spacing greater than the first spacing.

16. The method of claim 9 wherein the first plurality of metal fingers, the second plurality of metal fingers, the first terminal, and the second terminal are arranged in the same metallization level.

* * * * *